US012581593B2

(12) United States Patent
Hoshino et al.

(10) Patent No.: US 12,581,593 B2
(45) Date of Patent: Mar. 17, 2026

(54) PREPREG, AND METAL-CLAD LAMINATED BOARD AND WIRING SUBSTRATE OBTAINED USING SAME

(71) Applicant: PANASONIC INTELLECTUAL PROPERTY MANAGEMENT CO., LTD., Osaka (JP)

(72) Inventors: Yasunori Hoshino, Osaka (JP); Hiroaki Fujiwara, Nara (JP); Yuki Kitai, Osaka (JP); Takayoshi Ozeki, Osaka (JP); Mikio Sato, Osaka (JP); Masashi Koda, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 150 days.

(21) Appl. No.: 16/651,069

(22) PCT Filed: Sep. 28, 2018

(86) PCT No.: PCT/JP2018/036187
§ 371 (c)(1),
(2) Date: Mar. 26, 2020

(87) PCT Pub. No.: WO2019/065942
PCT Pub. Date: Apr. 4, 2019

(65) Prior Publication Data

US 2020/0223998 A1 Jul. 16, 2020

(30) Foreign Application Priority Data

Sep. 29, 2017 (JP) ................................ 2017-190993

(51) Int. Cl.
*C08J 5/24* (2006.01)
*H05K 1/03* (2006.01)

(52) U.S. Cl.
CPC ............ *H05K 1/0366* (2013.01); *C08J 5/244* (2021.05); *C08J 5/249* (2021.05); *H05K 1/0373* (2013.01); *C08J 2371/00* (2013.01); *H05K 2201/0284* (2013.01)

(58) Field of Classification Search
CPC ...... C08J 5/24; C08J 2371/00; C08J 2371/12; H05K 1/0366; H05K 1/0373; H05K 2201/0284; H05K 1/0271; H05K 2201/0251; H05K 2201/0209; H05K 2201/068
See application file for complete search history.

(56) References Cited

U.S. PATENT DOCUMENTS

| | | | | |
|---|---|---|---|---|
| 2007/0281566 | A1* | 12/2007 | Ohta | B32B 27/12 428/548 |
| 2009/0178832 | A1† | 7/2009 | Amou | |
| 2009/0266591 | A1 | 10/2009 | Amou et al. | |
| 2013/0101863 | A1* | 4/2013 | Mabuchi | C08L 63/00 428/457 |
| 2014/0073721 | A1 | 3/2014 | Yaginuma et al. | |
| 2016/0060429 | A1* | 3/2016 | Kitai | C08L 63/00 523/451 |
| 2017/0099731 | A1† | 4/2017 | Arisawa | |
| 2017/0158854 | A1† | 6/2017 | Ueno | |
| 2018/0297329 | A1 | 10/2018 | Kitai et al. | |

FOREIGN PATENT DOCUMENTS

| | | | |
|---|---|---|---|
| CN | 101570640 | A | 11/2009 |
| JP | H4-171796 | A | 6/1992 |
| JP | 2003252983 | A * | 9/2003 |
| JP | 2010-111758 | A | 5/2010 |
| JP | 2015-063608 | A | 4/2015 |
| JP | 2015207753 | A * | 11/2015 |
| JP | 2016-147986 | A | 8/2016 |
| JP | 2017-124551 | A | 7/2017 |
| WO | 2012/128313 | A | 9/2012 |

OTHER PUBLICATIONS

Machine Translation of JP 2015207753 A, https://patentscope.wipo.int/search/en/detail.jsf?docId=JP273895666&_cid=P10-KX4RD4-47913-1 (Year: 2015).*

Machine Translation of Ishii et al. (JP 2003252983 A) Abstract (Year: 2003).*

ISR issued in WIPO Patent Application No. PCT/JP2018/036187, dated Dec. 25, 2018, English translation.

* cited by examiner
† cited by third party

*Primary Examiner* — Callie E Shosho
*Assistant Examiner* — Bethany M Miller
(74) *Attorney, Agent, or Firm* — GREENBLUM & BERNSTEIN, P.L.C.

(57) ABSTRACT

One aspect of the present invention relates to a prepreg having a thermosetting resin composition or a semi-cured product of a thermosetting resin composition, and a fibrous base material, in which the thermosetting resin composition contains (A) a thermosetting resin containing a modified polyphenylene ether compound, (B) a first inorganic filler in which a molybdenum compound is present on at least a part of the surface, and (C) a second inorganic filler, a content of (B) the first inorganic filler is 0.1 parts by weight or more and 15 parts by weight or less, and a content of (C) the second inorganic filler is 200 parts by mass or less, with respect to 100 parts by weight of (A) the thermosetting resin, and the fibrous base material is a glass cloth containing quartz glass yarn.

3 Claims, 4 Drawing Sheets

PREPREG, AND METAL-CLAD LAMINATED BOARD AND WIRING SUBSTRATE OBTAINED USING SAME

TECHNICAL FIELD

The present invention relates to a prepreg, and a metal-clad laminate and a wiring substrate obtained using the same.

BACKGROUND ART

In recent years, since electric devices have increased signal capacity, semiconductor substrates and the like are required to have dielectric properties such as low permittivity and low dielectric loss tangent required for high-speed communication. There is also a demand for improved electrical characteristics to enable further long-distance transmission.

It is known that polyphenylene ethers (PPE) have excellent dielectric properties such as permittivity and dielectric loss tangent, and have excellent dielectric properties even in high frequency bands from MHz band to GHz band (high frequency regions). Therefore, polyphenylene ethers are considered to be used as, for example, a molding material for high frequency applications. More specifically, it has been considered to be used as a substrate material for constituting a base material of a printed wiring board provided in an electronic device including a high frequency band or the like.

On the other hand, a use of quartz glass has been studied as an effective means among various researches aimed at improving electrical characteristics. A prepreg in which this quartz glass (also referred to as Q glass or quartz) and the polyphenylene ether resin are combined has also been reported (Patent Literature 1).

However, it is expected to give properties such as low dielectric properties and low thermal expansion, by using a base material containing quartz glass (glass cloth) for the substrate material, whereas quartz glass has a drawback that it is very brittle due to high hardness of $SiO_2$, and there is a big problem when processing a substrate. Therefore, the actual situation is that the quartz glass has not yet been put to practical use.

CITATION LIST

Patent Literature

Patent Literature 1: WO 2012/128313 A

SUMMARY OF INVENTION

The present invention has been made in view of the above circumstances, and an object of the present invention is to provide a prepreg having excellent electrical characteristics such as dielectric properties and excellent workability during substrate processing. Also, an object of the present invention is to provide a metal-clad laminate and a wiring substrate including the prepreg.

The present inventors have conducted extensive research and found that the above problems can be solved by the following constitution.

That is, the prepreg according to an aspect of the present invention is a prepreg having a thermosetting resin composition or a semi-cured product of a thermosetting resin composition, and a fibrous base material, in which the thermosetting resin composition contains (A) a thermosetting resin containing a modified polyphenylene ether compound, (B) a first inorganic filler in which a molybdenum compound is present on at least a part of the surface, and (C) a second inorganic filler, a content of (B) the first inorganic filler is 0.1 parts by weight or more and 15 parts by weight or less, and a content of (C) the second inorganic filler is 200 parts by mass or less, with respect to 100 parts by weight of (A) the thermosetting resin, and the fibrous base material is a glass cloth containing quartz glass yarn.

DESCRIPTION OF EMBODIMENTS

Figure 1:
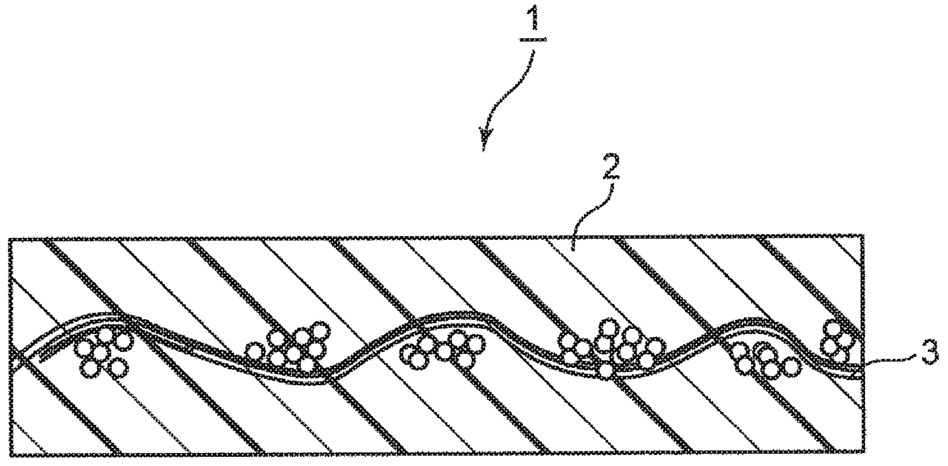
FIG. 1 is a schematic cross-sectional view showing a configuration of a prepreg according to an embodiment of the present invention.

The prepreg according to an aspect of the present invention is a prepreg having a thermosetting resin composition or a semi-cured product of a thermosetting resin composition, and a fibrous base material, in which the thermosetting resin composition contains (A) a thermosetting resin containing a modified polyphenylene ether compound, (B) a first inorganic filler in which a molybdenum compound is present on at least a part of the surface, and (C) a second inorganic filler, a content of (B) the first inorganic filler is 0.1 parts by weight or more and 15 parts by weight or less, and a content of (C) the second inorganic filler is 200 parts by mass or less, with respect to 100 parts by weight of (A) the thermosetting resin, and the fibrous base material is a glass cloth containing quartz glass yarn.

The prepreg of the present embodiment having such a configuration has excellent dielectric properties, heat resistance, and moldability, and is also excellent in workability such as drilling workability when processing a substrate.

Hereinafter, each configuration of the prepreg according to the present embodiment will be specifically described.

(A) Thermosetting Resin

The thermosetting resin composition used in the present embodiment contains (A) a thermosetting resin containing a modified polyphenylene ether compound. The modified polyphenylene ether compound used in the present embodiment may be a terminally modified polyphenylene ether compound, and examples thereof include a modified polyphenylene ether compound terminally modified with a substituent X as described later, having a polyphenylene ether chain in a molecule, and the like. Specific examples include modified polyphenylene ethers represented by the following formula (1) or (2).

[Chemical Formula 1]

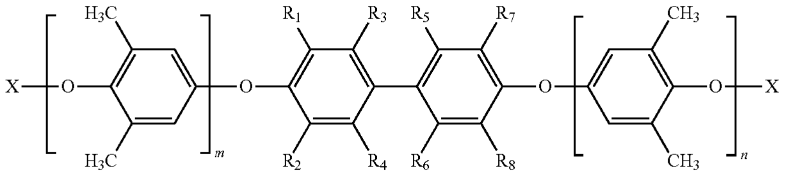

(1)

[Chemical Formula 2]

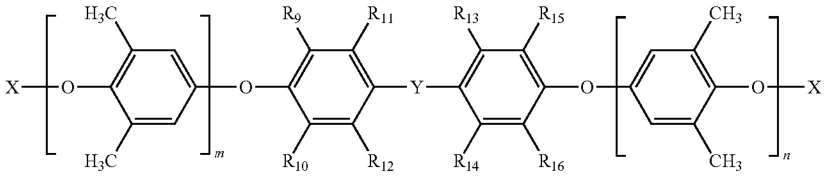

(2)

In the formulas (1) and (2), m and n are preferably such that the total value of m and n is, for example, 1 to 30. Moreover, m is preferably 0 to 20, and n is preferably 0 to 20. That is, it is preferred that m represents 0 to 20, n represents 0 to 20, and the sum of m and n represents 1 to 30.

Also, in the formulas (1) and (2), $R_1$ to $R_8$ and $R_9$ to $R_{16}$ are independent from each other. That is, $R_1$ to $R_8$ and $R_9$ to $R_{16}$ may be the same group or different groups. Further, $R_1$ to $R_8$ and $R_9$ to $R_{16}$ represent a hydrogen atom, an alkyl group, an alkenyl group, an alkynyl group, a formyl group, an alkylcarbonyl group, an alkenylcarbonyl group, or an alkynylcarbonyl group. Among them, a hydrogen atom and an alkyl group are preferable.

Specific examples of the functional groups listed in $R_1$ to $R_8$ and $R_9$ to $R_{16}$ include the following.

The alkyl group is not particularly limited, but is, for example, preferably an alkyl group of 1 to 18 carbons, and more preferably an alkyl group of 1 to 10 carbons. Specific examples thereof include a methyl group, an ethyl group, a propyl group, a hexyl group, a decyl group, and the like.

In addition, the alkenyl group is not particularly limited, but is, for example, preferably an alkenyl group having 2 to 18 carbons, and more preferably an alkenyl group having 2 to 10 carbons. Specific examples thereof include a vinyl group, an allyl group, a 3-butenyl group, and the like.

Also, the alkynyl group is not particularly limited, but is, for example, preferably an alkynyl group having 2 to 18 carbons, and more preferably an alkynyl group having 2 to 10 carbons. Specific examples thereof include an ethynyl group, a prop-2-yn-1-yl group (propargyl group), and the like.

Moreover, the alkylcarbonyl group is not particularly limited as long as it is a carbonyl group substituted with an alkyl group, but is, for example, preferably an alkylcarbonyl group having 2 to 18 carbons, and more preferably an alkylcarbonyl group having 2 to 10 carbons. Specific examples thereof include an acetyl group, a propionyl group, a butyryl group, an isobutyryl group, a pivaloyl group, a hexanoyl group, an octanoyl group, a cyclohexylcarbonyl group, and the like.

Further, the alkenylcarbonyl group is not particularly limited as long as it is a carbonyl group substituted with an alkenyl group, but is, for example, preferably an alkenylcarbonyl group having 3 to 18 carbons, and more preferably an alkenylcarbonyl group having 3 to 10 carbons. Specific examples thereof include an acryloyl group, a methacryloyl group, a crotonoyl group, and the like.

Furthermore, the alkynylcarbonyl group is not particularly limited as long as it is a carbonyl group substituted with an alkynyl group, but is, for example, preferably an alkynylcarbonyl group having 3 to 18 carbons, and more preferably an alkynylcarbonyl group having 3 to 10 carbons. Specific examples thereof include a propioloyl group and the like.

Next, in the formulas (1) and (2), examples of Y include linear, branched or cyclic hydrocarbons having 20 or less carbons. More specific examples include groups represented by the following formula (3) and the like.

[Chemical Formula 3]

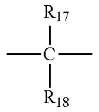

(3)

In the formula (3), $R_{17}$ and $R_{18}$ each independently represent a hydrogen atom or an alkyl group. Examples of the alkyl group include a methyl group and the like. In addition, examples of the group represented by the formula (3) include a methylene group, a methylmethylene group, a dimethylmethylene group, and the like.

Further, in the formulas (1) and (2), the substituent represented by X is preferably a substituent having a carbon-carbon unsaturated double bond.

The substituent having a carbon-carbon unsaturated double bond is not particularly limited. For example, examples of the substituent X include substituents represented by the following formula (4) and the like.

[Chemical Formula 4]

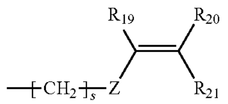

In the formula (4), s represents 0 to 10. In addition, Z represents an arylene group. Also, $R_{19}$ to $R_{21}$ are independent of each other. That is, $R_{19}$ to $R_{21}$ may be the same group or different groups. Moreover, $R_{19}$ to $R_{21}$ represent a hydrogen atom or an alkyl group.

In the formula (4), when s is 0, it represents a compound in which Z is directly bonded to a terminal of a polyphenylene ether.

This arylene group is not particularly limited. Specific examples include a monocyclic aromatic group such as a phenylene group, a polycyclic aromatic group in which the aromatic is not monocyclic but polycyclic aromatic such as a naphthalene ring, and the like. Also, the arylene group also includes derivatives in which a hydrogen atom bonded to an aromatic ring is substituted with a functional group such as an alkenyl group, an alkynyl group, a formyl group, an alkylcarbonyl group, an alkenylcarbonyl group, or an alkynylcarbonyl group. In addition, the alkyl group, although not particularly limited, is, for example, preferably an alkyl group of 1 to 18 carbons, and more preferably an alkyl group of 1 to 10 carbons. Specific examples thereof include a methyl group, an ethyl group, a propyl group, a hexyl group, a decyl group, and the like.

Further, more specific examples of the substituent X include vinylbenzyl groups (ethenylbenzyl groups) such as a p-ethenylbenzyl group and a m-ethenylbenzyl group, a vinylphenyl group, an acrylate group, a methacrylate group, and the like.

Preferable specific examples of the substituent X represented by the above formula (4) include functional groups including a vinylbenzyl group. Specific examples include at least one substituent selected from the following formulae (5) and (6) and the like.

[Chemical Formula 5]

(5)

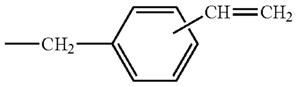

[Chemical Formula 6]

(6)

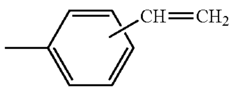

In addition to the above, the other substituent X having a carbon-carbon unsaturated double bond that is terminally modified in the modified polyphenylene ether used in the present embodiment includes a (meth)acrylate group, and for example, it is represented by the following formula (7).

[Chemical Formula 7]

(7)

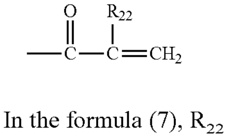

In the formula (7), $R_{22}$ represents a hydrogen atom or an alkyl group. The alkyl group, although not particularly limited, is, for example, preferably an alkyl group of 1 to 18 carbons, and more preferably an alkyl group of 1 to 10 carbons. Specific examples thereof include a methyl group, an ethyl group, a propyl group, a hexyl group, a decyl group, and the like.

Furthermore, the polyphenylene ether chain in the modified polyphenylene ether compound includes, in addition to the repeating units represented by the above formulas (1) and (2), for example, a repeating unit represented by the following formula (8) in a molecule.

[Chemical Formula 8]

(8)

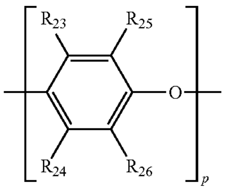

In the formula (8), p represents 1 to 50, corresponds to the total value of m and n in the formula (1) or formula (2), and is preferably 1 to 30. Also, $R_{23}$ to $R_{26}$ are independent of each other. That is, $R_{23}$ to $R_{26}$ may be the same group or different groups. Further, $R_{23}$ to $R_{26}$ represent a hydrogen atom, an alkyl group, an alkenyl group, an alkynyl group, a formyl group, an alkylcarbonyl group, an alkenylcarbonyl group, or an alkynylcarbonyl group. Among them, a hydrogen atom and an alkyl group are preferable. In addition, the groups listed in $R_{23}$ to $R_{26}$ are specifically the same as the groups listed in $R_1$ to $R_8$.

The weight average molecular weight (Mw) of the modified polyphenylene ether compound used in the present embodiment is not particularly limited. Specifically, it is preferably 500 to 5000, more preferably 800 to 4000, and further preferably 1000 to 3000. The weight average molecular weight may be a value measured by a general molecular weight measuring method, and specifically includes a value measured using gel permeation chromatography (GPC) and the like.

The modified polyphenylene ether compound having a weight average molecular weight in such ranges has excellent dielectric properties of the polyphenylene ether, and a cured product not only has more excellent heat resistance but also has excellent moldability. This is considered due to the following. A normal polyphenylene ether having a weight average molecular weight in such ranges has a relatively low molecular weight, thus the heat resistance of a cured product tends to decrease. In this respect, the modified polyphenylene ether compound according to the present embodiment has an unsaturated double bond at a terminal, and thus it is considered that a cured product having sufficiently high heat resistance is obtained. Further, it is considered that when the weight average molecular weight of the modified polyphenylene ether compound is within such ranges, the cured product also has excellent moldability. Therefore, it is considered to obtain such a modified polyphenylene ether compound having not only more excellent heat resistance of a cured product but also excellent moldability.

Also, in the modified polyphenylene ether compound used in the present embodiment, an average number of the substituents at a molecular terminal (the number of terminal functional groups) per one molecule of the modified polyphenylene ether is not particularly limited. Specifically, the number of terminal functional groups is preferably 1 to 5, more preferably 1 to 3, and further preferably 1.5 to 3. When the number of terminal functional groups is too small, it tends to be difficult to obtain a cured product having sufficient heat resistance. Moreover, when the number of terminal functional groups is too large, reactivity becomes too high, and for example, storability of a resin composition may deteriorate, or malfunctions such as deterioration of fluidity of the resin composition may occur. That is, when such a modified polyphenylene ether is used, due to lack of fluidity or the like, for example, molding defect such as generation of a void during multilayer molding might occur, causing a problem of moldability that it is difficult to obtain a highly reliable printed wiring board.

The number of terminal functional groups of the modified polyphenylene ether compound is, for example, a numerical value representing an average value of the substituents per one molecule in a whole modified polyphenylene ether compound present in 1 mol of the modified polyphenylene ether compound. The number of terminal functional groups can be determined by, for example, measuring the number of hydroxyl groups remaining in the obtained modified polyphenylene ether compound and calculating a decrease from the number of hydroxyl groups of the polyphenylene ether before modification. The decrease from the number of hydroxyl groups in the polyphenylene ether before modification is the number of terminal functional groups. Then, the number of hydroxyl groups remaining in the modified polyphenylene ether compound can be obtained by adding a quaternary ammonium salt associated with a hydroxyl group (tetraethylammonium hydroxide) to a solution of the modified polyphenylene ether compound, and measuring UV absorbance of the mixed solution.

In addition, the intrinsic viscosity of the modified polyphenylene ether compound used in the present embodiment is not particularly limited. Specifically, the intrinsic viscosity may be from 0.03 to 0.12 dl/g, but is preferably from 0.04 to 0.11 dl/g, and more preferably from 0.06 to 0.095 dl/g. When the intrinsic viscosity is too low, the molecular weight tends to be low, and it tends to be difficult to obtain low dielectric properties such as low permittivity and low dielectric loss tangent. On the other hand, when the intrinsic viscosity is too high, viscosity is high, sufficient fluidity cannot be obtained, and moldability of the cured product tends to decrease. Therefore, when the intrinsic viscosity of the modified polyphenylene ether compound is within the above ranges, excellent heat resistance and moldability of the cured product can be realized.

The intrinsic viscosity referred to herein is an intrinsic viscosity measured in methylene chloride at 25° C., and more specifically, for example, a value obtained by measuring a 0.18 g/45 ml methylene chloride solution (liquid temperature 25° C.) with a viscometer, or the like. Examples of the viscometer include AVS500 Visco System manufactured by SCHOTT Instruments GmbH and the like.

Further, a method for synthesizing the modified polyphenylene ether compound used in the present embodiment is not particularly limited as long as the method can synthesize the modified polyphenylene ether compound terminally modified with a substituent X as described above. Examples include a method of reacting a compound in which a substituent having a carbon-carbon unsaturated double bond and a halogen atom are bonded, with polyphenylene ether, and the like. Examples of the compound in which a substituent having a carbon-carbon unsaturated double bond and a halogen atom are bonded include compounds in which the substituent represented by any one of the above formulas (4) to (7) and a halogen atom are bonded, and the like. Specific examples of the halogen atom include a chlorine atom, a bromine atom, an iodine atom, and a fluorine atom, and among them, a chlorine atom is preferable. Specific examples of the compound in which a substituent having a carbon-carbon unsaturated double bond and a halogen atom are bonded include p-chloromethylstyrene, m-chloromethylstyrene, and the like.

The polyphenylene ether as a raw material is not particularly limited as long as it can finally synthesize a predetermined modified polyphenylene ether. Specific examples include a polyphenylene ether composed of 2,6-dimethylphenol and at least one of bifunctional phenol and trifunctional phenol, one containing a polyphenylene ether such as poly(2,6-dimethyl-1,4-phenylene oxide) as a main component, and the like. Also, the bifunctional phenol refers to a phenolic compound having two phenolic hydroxyl groups in a molecule, and examples thereof include tetramethyl bisphenol A and the like. Moreover, the trifunctional phenol refers to a phenolic compound having three phenolic hydroxyl groups in a molecule.

As an example of a method for synthesizing the modified polyphenylene ether compound, specifically, for example, the above polyphenylene ether and the compound represented by the formula (4) are dissolved in a solvent and stirred. This allows the polyphenylene ether to react with the compound represented by the formula (4), to obtain a modified polyphenylene ether used in the present embodiment.

Further, the reaction is preferably carried out in the presence of an alkali metal hydroxide. It is considered that this reaction thus proceeds suitably. This is considered because the alkali metal hydroxide functions as a dehydrohalogenating agent, specifically, a dehydrochlorinating agent. That is, it is considered that the alkali metal hydroxide desorbs a hydrogen halide from a phenol group of the polyphenylene ether, the compound represented by the formula (4), whereby the substituent X is bonded to an oxygen atom of the phenol group instead of a hydrogen atom of the phenol group of the polyphenylene ether.

Furthermore, the alkali metal hydroxide is not particularly limited as long as it can function as a dehalogenating agent, and examples thereof include sodium hydroxide and the like. Moreover, the alkali metal hydroxide is normally used in an aqueous solution state, and specifically, it is used as an aqueous sodium hydroxide solution.

In addition, reaction conditions such as reaction time and reaction temperature vary also depending on the compound represented by the formula (4) and the like, and are not particularly limited as long as the above reaction proceeds suitably. Specifically, the reaction temperature is preferably room temperature to 100° C., and more preferably 30° C. to 100° C. Also, the reaction time is preferably 0.5 to 20 hours, and more preferably 0.5 to 10 hours.

Moreover, the solvent used during the reaction is not particularly limited as long as it can dissolve the polyphenylene ether and the compound represented by the formula (4), and does not inhibit a reaction of the polyphenylene ether and the compound represented by the formula (4). Specific examples include toluene and the like.

Further, the above reaction is preferably carried out in a state where not only an alkali metal hydroxide but also a phase transfer catalyst is present. That is, the above reaction is preferably carried out in the presence of an alkali metal hydroxide and a phase transfer catalyst. It is considered that the above reaction thus proceeds more suitably. This is considered due to the following. It is considered due to the fact that a phase transfer catalyst is a catalyst which has a function of taking up an alkali metal hydroxide, is soluble both in a polar solvent phase such as water and also in a nonpolar solvent phase such as an organic solvent, and is capable of migrating between these phases. Specifically, in cases where an aqueous sodium hydroxide solution is used as the alkali metal hydroxide and an organic solvent such as toluene which is incompatible with water is used as the solvent, even if the aqueous sodium hydroxide solution is added dropwise to the solvent subjected to the reaction, it is considered that the solvent and the aqueous sodium hydroxide solution separate and the sodium hydroxide is unlikely to migrate to the solvent. Hence, it is considered that the aqueous sodium hydroxide solution added as the alkali metal hydroxide hardly contributes to promotion of the reaction. On the other hand, when the reaction is carried out in the presence of an alkali metal hydroxide and a phase transfer catalyst, it is considered that the alkali metal hydroxide migrates to the solvent in a state of being taken up by the phase transfer catalyst, and the aqueous sodium hydroxide solution is more likely to contribute to the promotion of the reaction. Therefore, it is considered that when the reaction is carried out in the presence of an alkali metal hydroxide and a phase transfer catalyst, the above reaction proceeds suitably.

Furthermore, the phase transfer catalyst is not particularly limited, and examples thereof include quaternary ammonium salts such as tetra-n-butylammonium bromide, and the like.

The resin composition according to the present embodiment preferably contains the modified polyphenylene ether obtained as described above as the modified polyphenylene ether.

The thermosetting resin composition of the present embodiment may contain a thermosetting resin other than the modified polyphenylene ether compound as described above. Examples of other usable thermosetting resin include an epoxy resin, an unsaturated polyester resin, a thermosetting polyimide resin, and the like.

In a preferred embodiment, the thermosetting resin is desirably a resin containing a modified polyphenylene ether and a crosslinking agent. Thereby, it is considered that more excellent heat resistance, electrical characteristics and the like can be obtained.

The crosslinking agent that can be used in the thermosetting resin composition of the present embodiment is not particularly limited as long as it can form a crosslink by being reacted with the modified polyphenylene ether compound to cure the thermosetting resin composition. It is preferably a crosslinking agent having a carbon-carbon unsaturated double bond in a molecule, and further preferably a compound having two or more carbon-carbon unsaturated double bonds in a molecule.

In addition, the crosslinking agent used in the present embodiment preferably has a weight average molecular weight of 100 to 5000, more preferably 100 to 4000, and further preferably 100 to 3000. When the weight average molecular weight of the crosslinking agent is too low, the crosslinking agent may easily volatilize from a blended component system of the resin composition. Moreover, when the weight average molecular weight of the crosslinking agent is too high, viscosity of varnish of the resin composition and melt viscosity during heat molding may be too high. Therefore, when the weight average molecular weight of the crosslinking agent is within such ranges, a resin composition more excellent in heat resistance of the cured product is obtained. This is considered to be because a crosslink can be suitably formed by the reaction with the modified polyphenylene ether compound. The weight average molecular weight may be a value measured by a general molecular weight measuring method, and specifically includes a value measured using gel permeation chromatography (GPC) and the like.

Specific examples of the crosslinking agent used in the present embodiment include trialkenyl isocyanurate compounds such as triallyl isocyanurate (TAIC), polyfunctional methacrylate compounds having two or more methacrylic groups in a molecule, polyfunctional acrylate compounds having two or more acrylic groups in a molecule, vinyl compounds having two or more vinyl groups in a molecule (polyfunctional vinyl compounds) such as polybutadiene, vinyl benzyl compounds such as styrene and divinylbenzene having a vinyl benzyl group in a molecule, and the like. Among them, those having two or more carbon-carbon double bonds in the molecule are preferable. Specific examples include trialkenyl isocyanurate compounds, polyfunctional acrylate compounds, polyfunctional methacrylate compounds, polyfunctional vinyl compounds, divinylbenzene compounds, and the like. When these are used, it is considered that crosslinking is more suitably formed by a curing reaction, and heat resistance of the cured product of the resin composition according to the present embodiment can be further increased. In addition, as the crosslinking agent, the exemplified crosslinking agents may be used alone or in combination of two or more thereof. Moreover, as the crosslinking agent, a compound having two or more carbon-carbon unsaturated double bonds in the molecule and a compound having one carbon-carbon unsaturated double bond in the molecule may be used in combination. Specific examples of the compound having one carbon-carbon unsaturated double bond in the molecule include compounds having one vinyl group in the molecule (monovinyl compounds), and the like.

Further, the content of the modified polyphenylene ether compound is preferably from 30 parts by mass to 90 parts by mass and more preferably from 50 parts by mass to 90 parts by mass, with respect to 100 parts by mass of a total of the modified polyphenylene ether compound and the crosslinking agent. Furthermore, the content of the crosslinking agent is preferably from 10 parts by mass to 70 parts by mass and more preferably from 10 parts by mass to 50 parts by mass, with respect to 100 parts by mass of a total of the modified polyphenylene ether compound and the crosslinking agent. That is, the content ratio of the modified polyphenylene ether compound and the crosslinking agent is preferably 90:10 to 30:70 and more preferably 90:10 to 50:50 by mass ratio. When each content of the modified polyphenylene ether compound and the crosslinking agent is a content that satisfies the above ranges, a resin composition more excellent in heat resistance and flame retardance of the cured product is obtained. This is considered to be because a curing reaction between the modified polyphenylene ether compound and the crosslinking agent proceeds suitably.

(B) First Inorganic Filler

The component (B) used in the present embodiment, that is, the first inorganic filler in which a molybdenum compound is present on at least a part of the surface will be described.

Although it is known that a molybdenum compound can be conventionally used as an inorganic filler, in the present embodiment, the first inorganic filler is an inorganic filler in which a molybdenum compound is present on part or all of the surface of an inorganic material other than molybdenum. The phrase "present on the surface" refers to a state that the molybdenum compound is supported on at least a part of the surface of the inorganic filler, at least a part of the surface of the inorganic filler is covered with the molybdenum compound, or the like.

The resin composition of the present embodiment contains the first inorganic filler in which a molybdenum compound is present on at least a part of the surface in an amount of 0.1 parts by mass or more and 15 parts by mass or less with respect to 100 parts by mass of the thermosetting resin described above. By containing the first inorganic filler in such a content, it is possible to provide a prepreg excellent in working performance during substrate processing such as drilling workability while being excellent in electrical characteristics and the coefficient of thermal expansion. From the viewpoint of obtaining still more excellent electrical characteristics, the blending amount of the first inorganic filler is preferably 0.1 parts by mass or more and 5 parts by mass or less.

The molybdenum compound that can be used in the present embodiment is preferably compound particles composed of at least one metal salt selected from, for example, zinc molybdate, calcium molybdate, and magnesium molybdate. By using such a molybdenum compound, it is considered that the above-described effects can be obtained more reliably.

As the first inorganic filler, various inorganic fillers other than molybdenum compounds can be used without particular limitation as long as the molybdenum compound is present on at least a part of the surface. Among them, talc is preferably used from the viewpoint of workability, heat resistance and chemical resistance.

The amount of the molybdenum compound present on the surface of the first inorganic filler is not particularly limited, but the molybdenum compound is preferably present in a ratio (mass ratio) of about 100:0.1 to 100:20 with respect to the first inorganic filler. Thereby, there is an advantage that workability can be improved without deteriorating heat resistance.

(C) Second Inorganic Filler

In addition to the first inorganic filler described above, the resin composition of the present embodiment contains a second inorganic filler in an amount of 200 parts by mass or less with respect to 100 parts by mass of the thermosetting resin. When the content of the second inorganic filler is 200 parts by mass or less, it is considered that sufficient moldability and workability can be obtained.

The lower limit of the content of the second inorganic filler is not particularly limited, but is preferably 50 parts by mass or more with respect to 100 parts by mass of the thermosetting resin. This is because it is possible to impart electrical characteristics and heat resistance to the resin composition.

The second inorganic filler that can be used in the present embodiment is not particularly limited, and examples thereof include spherical silica, barium sulfate, silicon oxide powder, crushed silica, calcined talc, barium titanate, titanium oxide, clay, alumina, mica, boehmite, zinc borate, zinc stannate, other metal oxides, metal hydrates, and the like. When such an inorganic filler is contained in the resin composition, it is considered that thermal expansion of a laminate or the like including the prepreg of the present embodiment can be suppressed, and dimensional stability can be improved.

Further, it is preferable to use silica because there are also advantages that heat resistance and dielectric loss tangent (Df) of the laminate can be improved.

The inorganic filler as described above may be subjected to surface treatment with a silane coupling agent or the like.

Other Components

The thermosetting resin composition of the present embodiment can contain other components in addition to the above-described components as long as the effects of the present invention are not impaired.

Specific examples include reaction initiators selected from organic peroxides, azo compounds, dihalogen compounds, flame retardants, resin modifiers, antioxidants, and the like.

Even if the polyphenylene ether resin composition is composed of a modified polyphenylene ether compound and a crosslinkable curing agent, the curing reaction can proceed. Moreover, even composed of only a modified polyphenylene ether, the curing reaction can proceed. However, it may be difficult to raise the temperature until curing proceeds depending on the process conditions, so a reaction initiator may be added. The reaction initiator is not particularly limited as long as it can promote the curing reaction between a modified polyphenylene ether and a crosslinkable curing agent. Specific examples include oxidizing agents such as α,α'-bis(t-butylperoxy-m-isopropyl)benzene, 2,5-dimethyl-2,5-di(t-butylperoxy)-3-hexyne, benzoyl oxide, 3,3',5,5'-tetramethyl-1,4-diphenoquinone, chloranil, 2,4,6-tri-t-butylphenoxyl, t-butylperoxyisopropyl monocarbonate, and azobisisobutyronitrile. Moreover, a carboxylic acid metal salt or the like can be used in combination as necessary. The curing reaction thus can be further promoted. Among them, α,α'-bis(t-butylperoxy-m-isopropyl)benzene is preferably used. Since α,α'-bis(t-butylperoxy-m-isopropyl)benzene has a relatively high reaction initiation temperature, the promotion of the curing reaction when it does not need to be cured, such as during prepreg drying, can be suppressed, and decrease in storage stability of the polyphenylene ether resin composition can be suppressed. Furthermore, α,α'-bis(t-butylperoxy-m-isopropyl)benzene has low volatility, and therefore does not volatilize during prepreg drying or storage and has good stability. Moreover, the reaction initiators may be used alone or in combination of two or more. In particular, when a reaction initiator is used, the reaction initiator is preferably used so that the amount added is from 0.1 parts by mass to 2 parts by mass with respect to 100 parts by mass of (A) the terminal-modified polyphenylene ether compound that is a thermosetting resin.

The "content" described above in the present embodiment refers to the content when each component is blended when adjusting the resin composition or the content in a varnish state.

Prepreg

Next, the prepreg of the present embodiment will be described.

FIG. 1 is a schematic cross-sectional view showing an example of a prepreg 1 according to an embodiment of the present invention. Each reference sign in the drawings indicates the following: 1 prepreg, 2 resin composition or semi-cured product of resin composition. 3 fibrous base material, 11 metal-clad laminate, 12 insulating layer, 13 metal foil, 14 wiring, 15 drill bit, 16 entry board, 21 wiring substrate.

As shown in FIG. 1, the prepreg 1 according to the present embodiment includes the thermosetting resin composition or a semi-cured product 2 of the thermosetting resin composition, and a fibrous base material 3. Examples of the prepreg 1 include those in which the fibrous base material 3 is present in the thermosetting resin composition or the semi-cured product 2 thereof. That is, the prepreg 1 includes the thermosetting resin composition or the semi-cured product thereof and the fibrous base material 3 present in the thermosetting resin composition or the semi-cured product 2 thereof.

In the present embodiment, the "semi-cured product" is a product that has been cured halfway to such an extent that the thermosetting resin composition can be further cured. That is, the semi-cured product is a semi-cured (B-staged) resin composition. For example, when the resin composition is heated, first, viscosity gradually decreases with melting, then curing starts, and viscosity gradually increases. In such a case, the semi-curing includes a state from a start of gradual viscosity increase to complete curing, and the like.

The prepreg according to the present embodiment may include a semi-cured product of the resin composition, or may include the uncured resin composition itself. That is, the prepreg according to the present embodiment may be a prepreg including the semi-cured product of the resin composition (the B-stage resin composition) and a fibrous base material, or may be a prepreg including the resin composition before curing (the A-stage resin composition) and a fibrous base material.

In the present embodiment, a glass cloth containing quartz glass yarn is used as the fibrous base material used when producing the prepreg. In the present embodiment, examples of the glass cloth containing quartz glass yarn include Q glass, QL glass, and the like.

In the present embodiment, the quartz glass yarn refers to glass containing 99.0% by mass or more of $SiO_2$ (silicon dioxide) with respect to the total amount (hereinafter also referred to as "Q glass").

By using a glass cloth made of such Q glass, it is possible to provide a prepreg having very excellent dielectric properties (low permittivity, low dielectric loss tangent) in the cured product of the prepreg. Then, workability deterioration caused by the Q glass can be suppressed by using the first inorganic filler as described above.

In addition, in the present embodiment, the QL glass cloth is a glass cloth having a hybrid structure composed of the Q glass and the L glass. The L glass means a glass cloth containing about 50% by mass to 60% by mass of $SiO_2$ (silicon dioxide), about 10% by mass to 25% by mass of $B_2O_3$ and 15% by mass or less of CaO. Usually, the QL glass is composed of L glass for warp and Q glass for weft. By using such QL glass, it is possible to provide a prepreg excellent in the balance between good low dielectric properties and drilling workability.

The relative permittivity (Dk) and dielectric loss tangent (Df) of each glass cloth are as follows:

Q Glass Dk: Over 3.3 to 3.8 or less, Df: 0.0017 or less

QL Glass Dk: Over 3.8 to 4.3 or less, Df: Over 0.0023 to 0.0033 or less

L Glass Dk: Over 4.2 to 4.7 or less, Df: Over 0.0033 to 0.0043 or less

In the present embodiment, the relative permittivity (Dk) and dielectric loss tangent (Df) of each glass cloth are values obtained by the following measuring methods. First, a substrate (copper-clad laminate) is prepared so that the resin content per 100% by mass of the prepreg is 60% by mass, and a copper foil is removed from the prepared copper-clad laminate to obtain a sample for evaluation of relative permittivity (Dk) and dielectric loss tangent (Df). Dk and Df of the obtained sample at a frequency of 10 GHz were measured by the cavity resonator perturbation method using a network analyzer (N5230A manufactured by Keysight Technologies LLC). From the Dk and Df values of the obtained sample (the cured product of the prepreg), Dk and Df of the glass cloth are calculated, based on the Dk and Df at 10 GHz in which the cured product of the resin composition was measured by the cavity resonator perturbation method, from the volume fraction of the glass cloth and the resin composition used for substrate preparation.

The fibrous base material of the present embodiment may be a surface-treated glass cloth, and as a surface treatment agent, for example, a silane coupling agent having a functional group such as a vinyl group, a styryl group, a methacrylic group, and an acrylic group can be preferably used.

The glass cloth is more preferably adjusted for air permeability by being subjected to opening treatment. Examples of the opening treatment include treatment performed by spraying high-pressure water on glass cloth, treatment performed by pressing the yarn continuously at an appropriate pressure with a press roll and compressing it flatly, and the like. The air permeability of the glass cloth is preferably 200 $cm^3/cm^2/sec$ or less, more preferably 3 to 100 $cm^3/cm^2/sec$, and further preferably 3 to 50 $cm^3/cm^2/sec$. When this air permeability is too high, opening of the glass cloth tends to be insufficient. Insufficient opening of the glass cloth causes pinholes during prepreg production, increases the coarseness and minuteness of the yarn to cause skew, and causes unevenness during processing such as drilling. Moreover, when the air permeability is too small, it means that strong opening treatment was performed and problems such as fluff tend to occur in the glass cloth. The air permeability is an air permeability measured with a Frazier type air permeability tester in accordance with JIS R3420 (2013). Further, the thickness of the fibrous base material is not particularly limited, but is preferably from 0.01 to 0.2 mm, more preferably from 0.02 to 0.15 mm, and further preferably from 0.03 to 0.1 mm.

The resin content in the prepreg is not particularly limited, but is, for example, preferably from 40% by mass to 90% by mass, more preferably from 50% by mass to 90% by mass, and further preferably from 60% by mass to 80% by mass. When the resin content is too low, it is difficult to obtain low dielectric properties. On the other hand, when the resin content is too high, the coefficient of thermal expansion (CTE) tends to increase or the plate thickness accuracy tends to decrease. The resin content referred to herein is a ratio of a mass obtained by subtracting a mass of the fibrous base material from a mass of the prepreg to a mass of the prepreg [=(Mass of Prepreg−Mass of Fibrous Base Material)/Mass of Prepreg×100].

The thickness of the prepreg is not particularly limited, but is, for example, preferably from 0.015 to 0.2 mm, more preferably from 0.02 to 0.15 mm, and further preferably from 0.03 to 0.13 mm. When the prepreg is too thin, the number of prepregs required to obtain a desired substrate thickness increases. On the other hand, when the prepreg is too thick, the resin content tends to be low, and it is difficult to obtain desired low dielectric properties.

Production Method of Prepreg

Next, a method for obtaining the prepreg of the present embodiment will be described.

When producing a prepreg, the thermosetting resin composition of the present embodiment described above is often prepared into a varnish form and used as resin varnish. Such a resin varnish is prepared, for example, as follows.

First, components that can be dissolved in an organic solvent, such as a modified polyphenylene ether compound, a crosslinking agent, and a reaction initiator, are charged into the organic solvent and dissolved. At this time, heating may be performed as necessary. Thereafter, a component that does not dissolve in an organic solvent, that is, an inorganic filler or the like, is added thereto and dispersed using a ball mill, a bead mill, a planetary mixer, a roll mill or the like, until the solution becomes a predetermined dispersed state, thereby preparing a varnish-like resin composition. The organic solvent used here is not particularly limited as long as it dissolves the modified polyphenylene ether compound, the crosslinking agent, the reaction initiator and the like and does not inhibit the curing reaction. Specific examples thereof include toluene, cyclohexanone, propylene glycol monomethyl ether acetate, and the like. These may be used alone or in combination of two or more.

Examples of the method for producing the prepreg 1 of the present embodiment using the obtained resin varnish include a method of impregnating the fibrous base material 3 with the obtained thermosetting resin composition 2 prepared in a resin varnish form, and then drying it.

The impregnation of the resin varnish (resin composition 2) into the fibrous base material 3 is performed by dipping and coating or the like. This impregnation can be repeated several times as necessary. At this time, it is also possible to repeat impregnation using a plurality of resin varnishes having different compositions and concentrations, and finally adjust to a desired composition (content ratio) and resin amount.

The fibrous base material 3 impregnated with the resin varnish (resin composition 2) is heated under desired heating conditions, for example, at 80° C. or more and 180° C. or less for 1 minute or more and 10 minutes or less. By heating, the solvent is volatilized from the varnish, and the prepreg 1 before curing (A-stage) or in a semi-cured state (B-stage) is obtained.

Metal-Clad Laminate

Figure 2:
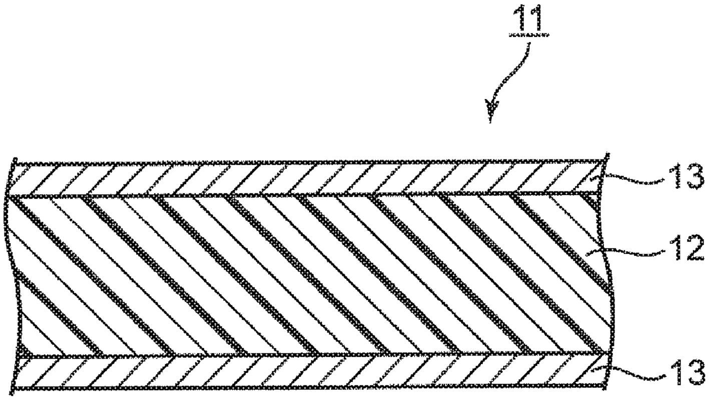
FIG. 2 is a schematic cross-sectional view showing a configuration of a metal-clad laminate according to an embodiment of the present invention.

As shown in FIG. 2, a metal-clad laminate 11 of the present embodiment contains an insulating layer 12 containing a cured product of the prepreg described above, and a metal foil 13.

Examples of a method of preparing a metal-clad laminate using the prepreg 1 obtained as described above include a method that can prepare a double-sided metal foil-clad or single-sided metal foil-clad laminate, by stacking one or more sheets of prepregs 1, further stacking the metal foil 13 such as a copper foil on both upper and lower surfaces or one surface thereof, and integrally laminating them by heat press molding. The heat press conditions can be appropriately set depending on the thickness of the laminate to be produced, the type of resin composition, and the like. For example, the temperature can be set at 170° C. to 220° C., the pressure can be set at 1.5 MPa to 5.0 MPa, and the time can be set at 60 minutes to 150 minutes.

Wiring Substrate

Figure 3:
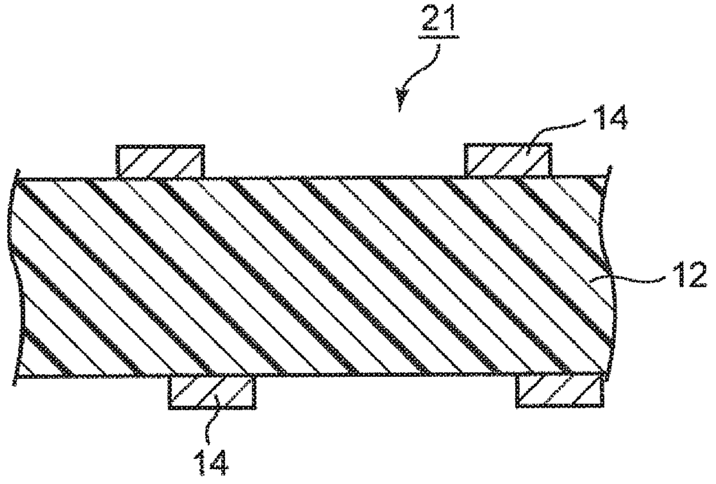
FIG. 3 is a schematic cross-sectional view showing a configuration of a wiring substrate according to an embodiment of the present invention.

As shown in FIG. 3, a wiring substrate 21 of the present embodiment has the insulating layer 12 containing a cured product of the prepreg described above, and wirings 14.

As a method for producing such a wiring substrate 21, for example, a circuit (wiring) is formed by etching the metal foil 13 on the surface of the metal-clad laminate 11 obtained described above or the like, whereby a wiring substrate 21 provided with a conductor pattern (wirings 14) as a circuit on the surface of the laminate can be obtained. The wiring substrate 21 obtained by using the resin composition of the present embodiment has excellent dielectric properties, and even when formed into a package in which a semiconductor chip is bonded, it is easy to mount, has no variation in quality, and is also excellent in signal speed and impedance. Furthermore, since the cured product of the prepreg of the present embodiment is excellent in workability, cracks and the like hardly occur during processing (etching, peeling, etc.), and it is excellent in moldability and handling properties.

The present specification discloses various aspects of the technologies as described above, and the main technologies are summarized below.

The prepreg according to an aspect of the present invention is a prepreg having a thermosetting resin composition or a semi-cured product of a thermosetting resin composition, and a fibrous base material, in which the thermosetting resin composition contains (A) a thermosetting resin containing a modified polyphenylene ether compound, (B) a first inorganic filler in which a molybdenum compound is present on at least a part of the surface, and (C) a second inorganic filler, a content of (B) the first inorganic filler is 0.1 parts by weight or more and 15 parts by weight or less, and a content of (C) the second inorganic filler is 200 parts by mass or less, with respect to 100 parts by weight of (A) the thermosetting resin, and the fibrous base material is a glass cloth containing quartz glass yarn.

With the above-described configuration, it is possible to provide a prepreg having excellent electrical characteristics such as dielectric properties and also excellent workability during substrate processing.

Also, in the prepreg, (A) the thermosetting resin preferably further contains a crosslinking agent. Thereby, it is considered that a prepreg having more excellent electrical characteristics can be provided reliably.

Further, in (B) the first inorganic filler, the molybdenum compound is preferably compound particles composed of at least one metal salt selected from zinc molybdate, calcium molybdate, and magnesium molybdate. Thereby, the above-described effect can be obtained more reliably.

Moreover, in the prepreg, the content of (C) the second inorganic filler is preferably 50 parts by mass or more with respect to 100 parts by mass of (A) the thermosetting resin. Thereby, further electrical characteristics and heat resistance can be imparted to the resin composition.

A metal-clad laminate according to still another aspect of the present invention contains the insulating layer containing a cured product of the prepreg described above, and a metal foil.

In addition, a wiring substrate according to still another aspect of the present invention contains the insulating layer containing a cured product of the prepreg described above, and wirings.

Since the prepreg, metal-clad laminate, and wiring substrate of the present invention are excellent in dielectric properties, moldability, heat resistance and workability, they are very useful for industrial use.

Hereinafter, the present invention will be further specifically described with reference to examples. However, the scope of the present invention is not limited to these examples.

EXAMPLES

First, in the examples, components used when preparing a thermosetting resin composition will be described.

Component A: Thermosetting Resin (Polyphenylene Ether Compound)

Modified PPE-1: A modified polyphenylene ether in which terminal hydroxyl groups of polyphenylene ether have been modified with methacrylic groups (a modified polyphenylene ether compound represented by the above formula (2), wherein Xs are methacrylic groups, and Y is a dimethylmethylene group (represented by the formula (3), wherein R17 and R18 in the formula (3) are methyl groups), SA9000 manufactured by SABIC Innovative Plastics, weight average molecular weight Mw 2000, the number of terminal functional groups 2)

Modified PPE-2: A modified polyphenylene ether obtained by reacting polyphenylene ether and chloromethylstyrene.

Specifically, these are modified polyphenylene ethers obtained by reacting as follows.

First, a 1 liter three-necked flask equipped with a temperature controller, a stirrer, a cooling apparatus and a dropping funnel was charged with 200 g of a polyphenylene ether (SA90 manufactured by SABIC Innovative Plastics, the number of terminal hydroxyl groups 2, weight average molecular weight Mw 1700), 30 g of a 50:50 (mass ratio) mixture of p-chloromethylstyrene and m-chloromethylstyrene (chloromethylstyrene: CMS manufactured by Tokyo Chemical Industry Co., Ltd.), 1.227 g of tetra-n-butylammonium bromide as a phase transfer catalyst, and 400 g of toluene, and the contents were stirred. Then, stirring was carried out until the polyphenylene ether, the chloromethylstyrene and the tetra-n-butylammonium bromide were dissolved in the toluene. At that time, the contents were gradually heated, and heated until the liquid temperature finally reached 75° C. Then, an aqueous sodium hydroxide solution (20 g of sodium hydroxide/20 g of water) was added dropwise to the solution over a period of 20 minutes as an alkali metal hydroxide. Thereafter, the mixture was further stirred at 75° C. for 4 hours. Next, after neutralizing the contents of the flask with 10% by mass hydrochloric acid, a large amount of methanol was charged thereinto. Thus, a precipitate was formed in the liquid in the flask. That is, the product contained in the reaction solution in the flask was reprecipitated. Then, the precipitate was taken out by filtration, washed three times with a 80:20 (mass ratio) mixed solution of methanol and water, and then dried at 80° C. under reduced pressure for 3 hours.

The resulting solid was analyzed by $^1$H-NMR (400 MHz, $CDCl_3$, TMS). As a result of NMR measurement, a peak attributable to a vinylbenzyl group (ethenylbenzyl group) was confirmed at 5 to 7 ppm. Hence, it was possible to confirm that the resulting solid was a modified polyphenylene ether having a vinylbenzyl group in a molecule as the substituent at the molecular terminal. Specifically, it was possible to confirm that the resulting solid was an ethenylbenzylated polyphenylene ether. The resulting modified polyphenylene ether compound is a modified polyphenylene ether compound represented by the above formula (2), wherein Xs are vinylbenzyl groups (ethenylbenzyl groups), and Y is a dimethylmethylene group (represented by the formula (3), wherein $R_{17}$ and $R_{18}$ in the formula (3) are methyl groups).

Moreover, the number of terminal functional groups of the modified polyphenylene ether was measured as follows.

First, the modified polyphenylene ether was accurately weighed. The weight at that time is defined as X (mg). Then, the weighed modified polyphenylene ether was dissolved in 25 mL of methylene chloride, and 100 μL of 10% by mass solution of tetraethylammonium hydroxide (TEAH) in ethanol (TEAH:ethanol (volume ratio)=15:85) was added to the solution. Thereafter, the absorbance (Abs) at 318 nm was measured using an UV spectrophotometer (UV-1600 manufactured by Shimadzu Corporation). And, from the measurement result, the number of terminal hydroxyl groups of the modified polyphenylene ether was calculated using the following formula.

$$\text{Amount of Remaining OH } (\mu\text{mol/g}) = [(25\times\text{Abs})/(\varepsilon\times\text{OPL}\times X)]\times 10^6$$

In the present specification, e represents an extinction coefficient, which is 4,700 L/mol·cm. Also, OPL is an optical path length of a cell, which is 1 cm.

Then, since the calculated amount of remaining OH (the number of terminal hydroxyl groups) of the modified polyphenylene ether was almost zero, it was found that the hydroxyl groups of the polyphenylene ether before modification were substantially modified. Base on this, it was found that the decrease from the number of terminal hydroxyl groups of the polyphenylene ether before modification was the number of terminal hydroxyl groups of the polyphenylene ether before modification. That is, it was found that the number of terminal hydroxyl groups of the polyphenylene ether before modification was the number of terminal functional groups of the modified polyphenylene ether. Namely, the number of terminal functional groups was two.

In addition, the intrinsic viscosity (IV) of the modified polyphenylene ether was measured in methylene chloride at 25° C. Specifically, the intrinsic viscosity (IV) of the modified polyphenylene ether was determined by measuring a 0.18 g/45 mL solution of the modified polyphenylene ether in methylene chloride (liquid temperature 25° C.) with a viscometer (AVS500 Visco System manufactured by Schott Instruments GmbH). As a result, the intrinsic viscosity (IV) of the modified polyphenylene ether was 0.086 dl/g.

Further, the molecular weight distribution of the modified polyphenylene ether was measured using GPC. Then, the weight average molecular weight (Mw) was calculated from the resulting molecular weight distribution. As a result, Mw was 2300.

Unmodified PPE: Polyphenylene ether (SA90 manufactured by SABIC Innovative Plastics, intrinsic viscosity (IV) 0.083 dl/g, the number of terminal hydroxyl groups 2, weight average molecular weight Mw 1700)

(Crosslinking Agent)

TAIC: Triallyl isocyanurate (TAIC manufactured by Nihon Kasei CO., LTD, molecular weight 249, the number of terminal double bonds 3)

DCP: Tricyclodecane dimethanol dimethacrylate (DCP manufactured by Shin-Nakamura Chemical Co., Ltd., the number of terminal double bonds 2)

(Epoxy Resin)

Epoxy resin: Dicyclopentadiene type epoxy resin (Epiclon HP7200 manufactured by DIC Corporation, the average number of epoxy groups 2.3)

Inorganic Filler (First Inorganic Filler)

KG-911C: Zinc molybdate-treated talc (manufactured by Huber)

KG-911A: Calcium molybdate-treated talc (manufactured by Huber)

(Second Inorganic Filler)

SC-2300SVJ: Spherical silica (manufactured by Admatechs Company Limited)

(Other)

Zinc molybdate (manufactured by Wako Pure Chemical Industries, Ltd.)

Reaction Initiator

Peroxide: "Perbutyl P (PBP)" (manufactured by NOF Corporation)

Imidazole-based reaction initiator: "2E4MZ" (manufactured by SHIKOKU CHEMICALS CORPORATION, 2-ethyl 4-methylimidazole)

Fibrous Base Material

Q Glass: Glass cloth obtained by surface-treating quartz glass cloth SQF2116AC-04, #1078 type manufactured by Shin-Etsu Quartz Products Co., Ltd.) with a silane coupling agent having a methacrylic group in a molecule (air permeability: 25 $cm^3/cm^2/sec$, Dk: 3.5, Df: 0.0015)

QL Glass: Hybrid glass of Q glass and L glass (QL glass manufactured by Asahi Kasei Corporation, #1078 type) (air permeability: 20 $cm^3/cm^2/sec$, Dk: 4.0, Df: 0.0028)

L Glass: L Glass cloth (general-purpose low dielectric glass cloth, L1078 manufactured by Asahi Kasci Corporation, #1078 type) (air permeability: 20 $cm^3/cm^2/sec$, Dk: 4.5, Df: 0.0038)

Examples 1 to 10, Comparative Examples 1 to 8

[Preparation Method] (Resin Varnish)

First, components other than the inorganic filler were added to toluene at blending ratios (parts by mass) shown in Table 1 so that the solid content concentration was 60% by mass, and mixed. The mixture was stirred at room temperature for 60 minutes. Thereafter, the inorganic filler was added to the resulting liquid, and the inorganic filler was dispersed by a bead mill. Thus, a varnish-like resin composition (varnish) was obtained.

(Prepreg and Copper-Clad Laminate)

Next, after impregnating the fibrous base material (the glass cloth) shown in Table 1 with the obtained varnish, prepregs were prepared by heating and drying at 130° C. for about 3 to 8 minutes. At that time, the resin composition content (resin content) with respect to the weight of the prepreg was adjusted to about 55% by mass.

Then, 4 sheets of the resulting prepregs were stacked and heated and pressed under conditions of a temperature of 200° C., 2 hours, and a pressure of 3 MPa, to obtain evaluation substrates (cured products of the prepregs).

In addition, 6 sheets of the resulting prepregs were stacked, and a copper foil ("FV-WS" of FURUKAWA ELECTRIC CO., LTD., thickness of 35 μm) was placed on both sides of the prepregs to form pressurized bodies. The pressurized bodies were heated and pressed under conditions of a temperature of 200° C. and a pressure of 3 MPa for 2 hours to prepare copper foil-clad laminates that were evaluation substrates with the copper foils bonded to both sides (metal-clad laminates), with a thickness of 750 μm.

The evaluation substrates (the cured products of the prepregs, the metal-clad laminates) prepared as described above were evaluated by the following method.

Evaluation Tests

The prepregs and evaluation laminates prepared as described above were evaluated by the following methods.

[Dielectric Properties (Dielectric Loss Tangent (Df)]

The dielectric loss tangent of each evaluation substrate (the cured products of the prepregs obtained above) at 10 GHz was measured by a cavity resonator perturbation method. Specifically, the dielectric loss tangent of the evaluation substrates at 10 GHz was measured using a network analyzer ("N5230A" manufactured by Agilent Technologies, Inc.). As an evaluation standard, a Df of 0.002 or less is defined as a passing line.

[Drilling Workability (Hole Position Accuracy)]

Figure 4:
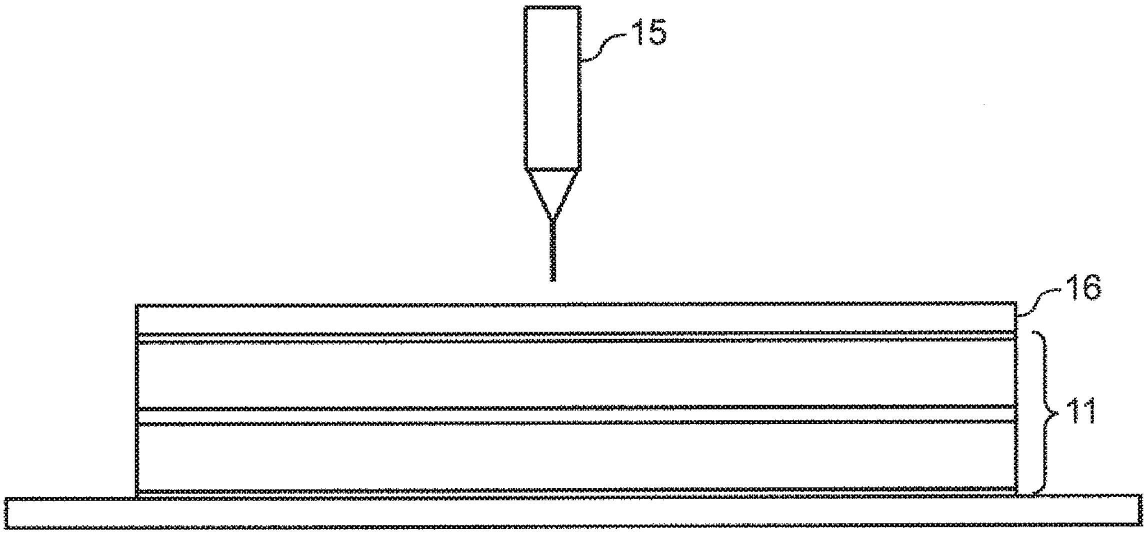
FIG. 4 is a schematic view showing a drilling workability evaluation test performed in Examples.

Using the evaluation substrate (the copper-clad laminate obtained above), the substrate was installed as shown in FIG. 4, and the hole position accuracy after 5000 hits was measured under the following drilling conditions.

Drilling Conditions:

Entry board: Al 0.15 mm

Number of stacked sheets: 0.75 mm×2 sheets stacked

Hole diameter: 0.3φ×5.5

Bit part number: NHUL020

Rotation speed: 160 Krpm

Feed rate: 20 μ/rev

Hit number: 5000 hits

As an evaluation standard, a hole position accuracy of 50 μm or less was determined as acceptable.

[Heat Resistance]

Using the evaluation substrate (the copper-clad laminate obtained above), heat resistance was evaluated according to the standard of JIS C 6481. The copper-clad laminate cut out into a predetermined size was left in a thermostat set at 280° C. for 1 hour and then taken out. Then, the heat-treated test piece was visually observed, and it was evaluated as "○" when swelling did not occur, and it was evaluated as "×" when swelling occurred.

[Moldability]

In the molded sample, moldability was evaluated by microscopic observation (SEM) according to the following criteria with respect to a sample from which the copper foil was removed by etching.

Moldability Evaluation Criteria:

○: No voids or blurs occur on the surface and cross section of the molded product ×: Voids and blurs occur as a result of observation of the surface and cross section of the molded product The test results above are shown in Table 1.

TABLE 1

| Structural component | | Example 1 | Example 2 | Example 3 | Example 4 | Example 5 | Example 6 | Example 7 | Example 8 |
|---|---|---|---|---|---|---|---|---|---|
| PPE | Modified PPE-1 | 70 | 70 | 70 | 70 | 70 | 70 | 70 | |
| | Modified PPE-2 | | | | | | | | 70 |
| | Unmodified PPE | | | | | | | | |
| Crosslinking agent | TAIC | 30 | 30 | 30 | 30 | 30 | 30 | 30 | 30 |
| | DCP | | | | | | | | |
| Epoxy resin | HP-7200 | | | | | | | | |
| Reaction initiator | PBP | 0.5 | 0.5 | 0.5 | 0.5 | 0.5 | 0.5 | 0.5 | 0.5 |
| | 2E4MZ | | | | | | | | |
| First filler | KG-911C | 1 | 3 | 9 | 15 | | 3 | 3 | 3 |
| | KG-911A | | | | | 3 | | | |
| | Zinc molybdate | | | | | | | | |
| Second filler | SC-2300SVJ | 100 | 100 | 100 | 100 | 100 | 50 | 200 | 100 |
| Glass cloth | Q Glass | ○ | ○ | ○ | ○ | ○ | ○ | ○ | ○ |
| | QL Glass | | | | | | | | |
| | L Glass | | | | | | | | |
| Evaluation | | | | | | | | | |
| Df | | 0.0017 | 0.0018 | 0.0019 | 0.002 | 0.0018 | 0.0019 | 0.0017 | 0.0017 |
| Hole position accuracy (after 5000 hits) | | 47 | 38 | 33 | 30 | 40 | 35 | 46 | 37 |
| Oven heat resistance (280° C.) | | ○ | ○ | ○ | ○ | ○ | ○ | ○ | ○ |
| Moldability | | ○ | ○ | ○ | ○ | ○ | ○ | ○ | ○ |

| Structural component | | Example 9 | Example 10 | Comparative Example 1 | Comparative Example 2 | Comparative Example 3 | Comparative Example 4 |
|---|---|---|---|---|---|---|---|
| PPE | Modified PPE-1 | 70 | 70 | 70 | 70 | 70 | 70 |
| | Modified PPE-2 | | | | | | |
| | Unmodified PPE | | | | | | |
| Crosslinking agent | TAIC | | 30 | 30 | 30 | 30 | 30 |
| | DCP | 30 | | | | | |
| Epoxy resin | HP-7200 | | | | | | |
| Reaction initiator | PBP | 0.5 | 0.5 | 0.5 | 0.5 | 0.5 | 0.5 |
| | 2E4MZ | | | | | | |
| First filler | KG-911C | 3 | 1 | | 20 | 3 | 3 |
| | KG911A | | | | | | |
| | Zinc molybdate | | | | ○ | | |
| Second filler | SC-2300SVJ | 100 | 100 | 100 | 100 | 250 | 100 |
| Glass cloth | Q Glass | ○ | | ○ | ○ | ○ | |
| | QL Glass | | ○ | | | | |
| | L Glass | | | | | | ○ |
| Evaluation | | | | | | | |
| Df | | 0.0019 | 0.0019 | 0.0017 | 0.0023 | 0.0016 | 0.0025 |
| Hole position accuracy (after 5000 hits) | | 39 | 36 | 89 | 27 | 51 | 20 |
| Oven heat resistance (280° C.) | | ○ | ○ | ○ | x | ○ | ○ |
| Moldability | | ○ | ○ | ○ | ○ | x | ○ |

TABLE 1-continued

| Structural component | | Comparative Example 5 | Comparative Example 6 | Comparative Example 7 | Comparative Example 8 |
|---|---|---|---|---|---|
| PPE | Modified PPE-1 | 70 | | 70 | 70 |
| | Modified PPE-2 | | | | |
| | Unmodified PPE | | 70 | | |
| Crosslinking agent | TAIC | 30 | | 30 | 30 |
| | DCP | | | | |
| Epoxy resin | HP-7200 | | 30 | | |
| Reaction initiator | PBP | 0.5 | | 0.5 | 0.5 |
| | 2E4MZ | | 0.5 | | |
| First filler | KG-911C | | 3 | | |
| | KG911A | | | | |
| | Zinc molybdate | | | | |
| Second filler | SC-2300SVJ | 100 | 100 | 100 | 100 |
| Glass cloth | Q Glass | | ○ | ○ | |
| | QL Glass | | | | ○ |
| | L Glass | ○ | | | |
| Evaluation | | | | | |
| Df | | 0.0024 | 0.0042 | 0.0023 | 0.0019 |
| Hole position accuracy (after 5000 hits) | | 22 | 38 | 32 | 53 |
| Oven heat resistance (280° C.) | | ○ | ○ | x | ○ |
| Moldability | | ○ | ○ | ○ | ○ |

(Discussion)

From the results in Table 1, it was shown that the present invention can provide a prepreg and a laminate having very excellent dielectric properties, heat resistance and moldability, and excellent drilling workability. On the other hand, in the comparative examples using the prepreg different from the configuration of the present invention, it resulted in that at least one of the evaluation items was inferior to the examples.

In particular, Comparative Example 1 and Comparative Example 8 that do not contain the first inorganic filler in which a molybdenum compound is present on at least a part of the surface resulted in good dielectric properties and the like, but poor drilling workability On the other hand, in Comparative Example 2 in which the content of the first inorganic filler was too large, sufficient dielectric properties and heat resistance could not be obtained.

Moreover, Comparative Example 3 in which the content of the second inorganic filler was excessive resulted in poor drilling workability and moldability.

In Comparative Examples 4 and 5 in which Q glass or QL glass was not used as the fibrous base material of the prepreg, drilling workability was excellent, but the target dielectric properties in the present invention could not be achieved. Further, Comparative Example 6 using unmodified PPE as the thermosetting resin also resulted in poor dielectric properties.

Also, in Comparative Example 7 in which the molybdenum compound was not made present on the surface of the first inorganic filler but was used as an inorganic filler as it was, sufficient dielectric properties and heat resistance could not be obtained.

Furthermore, in Comparative Examples 4 and 5 using L glass, even when using the first inorganic filler in which a molybdenum compound is present on at least a part of the surface, there was not much difference in drilling workability. On the other hand, when Q glass or QL glass was used, it was found that drilling workability was dramatically improved by using the first inorganic filler in which a molybdenum compound is present on at least a part of the surface (comparison between Examples 1 to 4 and 10 and Comparative Examples 1 and 8).

This application is based on Japanese Patent Application No. 2017-190993 filed on Sep. 29, 2017, the content of which is included in the present application.

In order to describe the present invention, the present invention has been properly and fully described in the preceding through embodiments with reference to specific examples and the like. However, it should be recognized that these embodiments can be readily modified and/or improved by those skilled in the art. Accordingly, insofar as a modified form or improved form devised by those skilled in the art is not at a level that departs from the scope of rights described in the claims, such a modified form or improved form is construed to be encompassed by this scope of rights.

Industrial Applicability

The present invention has wide industrial applicability in a technical field related to electronic materials and various devices including the same.

The invention claimed is:

1. A prepreg having a thermosetting resin composition or a semi-cured product of a thermosetting resin composition, and a fibrous base material, wherein the thermosetting resin composition contains (A) a thermosetting resin containing a modified polyphenylene ether compound and a crosslinking agent, (B) a first inorganic filler comprised of talc in which a molybdenum compound is present on at least a part of the surface, wherein the molybdenum compound is a compound containing at least one metal salt selected from zinc molybdate and calcium molybdate, and (C) a second inorganic filler comprised of spherical silica, the modified polyphenylene ether compound contains at least either a polyphenylene ether compound modified with methacrylic group or a polyphenylene ether compound modified with vinylbenzyl group, the crosslinking agent contains at least one selected from the group consisting of trialkenyl isocyanurate compound, polyfunctional methacrylate compound, polyfunctional acrylate compound, polyfunctional vinyl compounds, and vinyl benzyl compound, a content of (B) the first inorganic filler is 1 part by mass or more and 15 parts by mass or less, and a content of (C) the second inorganic filler is 50 parts by mass or more and 200 parts by mass or less, with respect to 100 parts by mass of (A) the thermosetting resin, the fibrous base material comprises a glass cloth containing quartz glass yarn, dielectric loss tangent at 10 GHz of a cured product of the prepreg is 0.002 or less, and the content of the modified polyphenylene ether compound is from 50 parts by mass to 90 parts by mass with respect to 100 parts by mass of a total of the modified polyphenylene ether compound and the crosslinking agent.

2. A metal-clad laminate comprising an insulating layer containing a cured product of the prepreg according to claim 1, and a metal foil.

3. A wiring substrate comprising an insulating layer containing a cured product of the prepreg according to claim 1, and wiring.

* * * * *